(12) United States Patent
Choi

(10) Patent No.: US 9,431,463 B2
(45) Date of Patent: Aug. 30, 2016

(54) DISPLAY APPARATUS

(71) Applicant: LG Display Co., Ltd., Seoul (KR)

(72) Inventor: Howon Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/697,965

(22) Filed: Apr. 28, 2015

(65) Prior Publication Data

US 2015/0318447 A1 Nov. 5, 2015

(30) Foreign Application Priority Data

Apr. 30, 2014 (KR) .................. 10-2014-0052150
May 12, 2014 (KR) .................. 10-2014-0056735

(51) Int. Cl.
| | |
|---|---|
| *H01L 33/00* | (2010.01) |
| *H01L 27/32* | (2006.01) |
| *H01L 33/44* | (2010.01) |
| *H01L 27/28* | (2006.01) |
| *H01L 21/02* | (2006.01) |
| *H01L 51/52* | (2006.01) |

(52) U.S. Cl.
CPC ....... *H01L 27/322* (2013.01); *H01L 21/02104* (2013.01); *H01L 27/283* (2013.01); *H01L 27/3241* (2013.01); *H01L 33/005* (2013.01); *H01L 33/44* (2013.01); *H01L 51/5284* (2013.01)

(58) Field of Classification Search
CPC ..... H01L 33/00; H01L 33/44; H01L 33/005; H01L 21/02104; H01L 27/3241; H01L 27/283
See application file for complete search history.

(56) References Cited

U.S. PATENT DOCUMENTS

| | | | |
|---|---|---|---|
| 8,427,624 B2* | 4/2013 | Matsui .................. | G02F 1/1337 349/153 |
| 9,123,287 B2* | 9/2015 | Su .......................... | G09G 3/3208 |
| 2013/0141678 A1* | 6/2013 | Chin .................. | G02F 1/133345 349/106 |
| 2014/0353626 A1* | 12/2014 | Shim .................... | G02B 3/0037 257/40 |

* cited by examiner

*Primary Examiner* — Phuc Dang
(74) *Attorney, Agent, or Firm* — Fenwick & West LLP

(57) ABSTRACT

Provided are a display apparatus and a method of manufacturing the display apparatus. A color filter layer including at least a red color filter, a green color filter, and a blue color filter is disposed on a first substrate. A black matrix is disposed on the color filter layer. A color filter overlapped unit where the red, green and blue color filters are overlapped is disposed in a black matrix area corresponding to the black matrix. The color filter overlapped unit has a lower reflectivity with respect to an external light than the other color filters. The color filter overlapped unit is formed in the black matrix area, and the color filter overlapped unit is formed by overlapping the blue, red and green color filters in order, and, thus, can prevent mixing of colors and reduce reflection with respect to an external light.

18 Claims, 12 Drawing Sheets

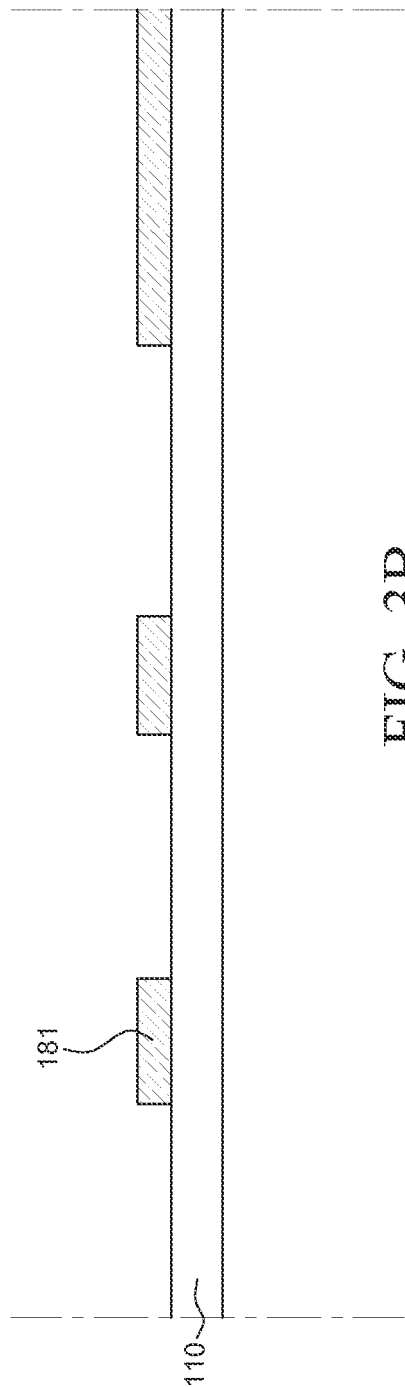

DISPLAY APPARATUS

CROSS-REFERENCE TO RELATED APPLICATIONS

This application claims the priority of Korean Patent Application No. 10-2014-0052150 filed on Apr. 30, 2014 and Korean Patent Application No. 10-2014-0056735 filed on May 12, 2014, in the Korean Intellectual Property Office, the disclosure of which is incorporated herein by reference.

BACKGROUND OF THE INVENTION

1. Field of the Invention

The present invention relates to a display apparatus and a method of manufacturing the same, and more particularly, to a display apparatus, which is slim and can improve visibility by reducing reflectivity, and a method of manufacturing the same.

2. Description of the Related Art

In recent years, display apparatuses such as an LCD (liquid crystal display) and an OLED (organic light-emitting diode display) have drawn attention as flat panel display apparatuses. In particular, display apparatuses including organic light-emitting diodes are advantageous in terms of power consumption since they do not need a separate light source and also in terms of producing a clear image.

A display apparatus using organic light-emitting diodes is manufactured by forming a thin film transistor and an organic light emitting layer on a substrate. If a white organic light emitting element is used as an organic light emitting element, a color filter is provided on an upper plate so as to express a color.

Such a display apparatus using a white organic light emitting element may be configured as a three-sub-pixel structure with red, green, and blue sub-pixels using color filters to express colors, or may be configured as a four-sub-pixel structure by adding a white sub-pixel to the three-sub-pixel structure.

If the white sub-pixel is added to the red, green, blue three-sub-pixel structure so as to express colors, it is not necessary to drive all the sub-pixels in order to express a white color. Thus, it is advantageous in reducing power consumption of the display apparatus.

Meanwhile, a color filter layer is not necessarily needed for the white sub-pixel. Therefore, an external light may be reflected from a white sub-pixel electrode constituting the white sub-pixel, and, thus, when using the display apparatus, a user may have a problem with visibility.

Therefore, generally, in order to reduce reflectivity with respect to an external light in a display apparatus using a white organic light emitting element, a polarization plate is attached to the outside of the display apparatus.

However, the polarization plate is thick and rigid. Therefore, it increases thickness and manufacturing costs of the display apparatus and also makes it difficult to come up with a flexible display.

SUMMARY OF THE INVENTION

As for a display apparatus using a white organic light emitting element, the display apparatus is manufactured by forming a color filter and a black matrix on a first substrate's side, forming an organic light emitting element on a second substrate's side, and bonding the first substrate and the second substrate.

To be more specific, a thin film transistor (TFT) is formed on the second substrate's side where a pixel electrode, an organic light emitting layer, and a common electrode are formed on the thin film transistor. The organic light emitting layer emits a light when a hole and an electron injected through the common electrode and the pixel electrode recombine to form an exciton that decays radiatively.

Meanwhile, a color filter layer is formed on the first substrate's side and transmits the light emitted from the organic light emitting layer, so that a color is expressed.

When an external light is incident in a display apparatus as described above, the external light is reflected, which may cause a decrease in visibility.

To be specific, a path for incidence and reflection of the external light will be described. The external light projected from the outside is incident toward the organic light emitting element through the first substrate and is reflected from the pixel electrode and the like constituting the organic light emitting element, and the reflected light is released to the outside along the path for incidence of the external light. Particularly, in the display apparatus using a white organic light emitting element, a color filter layer is not necessarily needed for a white sub-pixel unlike the surrounding colored sub-pixels. Thus, the white sub-pixel has a higher internal reflectivity with respect to the external light than the surrounding colored sub-pixels such as red, blue, and green sub-pixels.

Therefore, in order to reduce reflectivity with respect to the external light and thus improve visibility, a polarization plate is attached to an outer surface of the first substrate of the display apparatus.

The polarization plate has an effect of primarily reducing the external light incident in the display apparatus and secondarily reducing light reflected from an internal element among the external light penetrating the polarization plate.

However, in the case of using a polarization plate, the polarization plate requires high manufacturing costs, and it is difficult to come up with a flexible and thin display apparatus due to rigidity and thickness of the polarization plate.

Accordingly, an object of the present invention is to provide an improved display apparatus and a method of manufacturing the same. In the display apparatus using an organic light emitting element, reflectivity with respect to an external light is reduced, a thickness of the display apparatus is reduced, and a flexible display apparatus can be produced.

Further, another object of the present invention is to provide a display apparatus improved in visibility by reducing reflectivity with respect to an external light from a white sub-pixel of the display apparatus using an organic light emitting element and a method of manufacturing the same.

The objects of the present invention are not limited to the aforementioned objects, and other objects, which are not mentioned above, will be apparent to a person having ordinary skill in the art from the following description.

According to an aspect of the present invention to achieve the above-described objects, there is provided a display apparatus. A color filter layer including at least a red color filter, a green color filter, and a blue color filter is disposed on a first substrate. A black matrix is disposed on the color filter layer. A color filter overlapped unit where the red, green and blue color filters are overlapped is disposed in a black matrix area corresponding to the black matrix. The color filter overlapped unit has a lower reflectivity with respect to an external light than that of the other color filters.

According to another feature of the present invention, the color filter overlapped unit has a structure in which the blue, red and green color filters are stacked on the first substrate in order of increasing reflectivity.

According to yet another feature of the present invention, the display apparatus further includes a second substrate which faces the first substrate and on which an organic light emitting element is disposed, and wherein the organic light emitting element is a white light emitting element.

According to still another feature of the present invention, the display apparatus further includes a plurality of sub-pixels defined by the black matrix and the organic light emitting element, and the plurality of sub-pixels include a white sub-pixel.

According to still another feature of the present invention, the color filter layer further includes a color filter segment unit disposed on the white sub-pixel.

According to still another feature of the present invention, the color filter segment unit includes at least one of red, blue and green segments.

According to still another feature of the present invention, the display apparatus further includes a black matrix disposed on the color filter segment unit.

According to still another feature of the present invention, the display apparatus further includes an auxiliary color segment on the color filter segment unit, and wherein the auxiliary color segment is formed by extending a part of the color filter segment unit.

According to another aspect of the present invention to achieve the above-described objects, there is provided a method of manufacturing a display apparatus. The method of manufacturing a display apparatus includes: forming a blue color filter at least in a black matrix area on a first substrate; forming a red color filter at least in the black matrix area on the first substrate; forming a green color filter at least in the black matrix area on the first substrate; forming an overcoating layer to planarize upper portions of the blue, red and green color filters; forming a black matrix in the black matrix area on the overcoating layer; forming a thin film transistor and an organic light emitting element on a second substrate; and bonding the first and second substrates.

According to another feature of the present invention, each of the forming the blue color filter, the forming the red color filter and the forming the green color filter includes an etching process using a mask.

According to yet another feature of the present invention, the etching process includes a dry etching process.

Details of other exemplary embodiments will be included in the detailed description of the invention and the accompanying drawings.

According to an exemplary embodiment of the present invention, by increasing an area for the blue color filter comparable to the areas for the red and green color filters, the display apparatus may have a reduced reflectivity with respect to an external light. Further, since the color filter overlapped unit is provided in the black matrix area, reflectivity with respect to an external light can be reduced and mixing of colors in the display apparatus can be prevented.

Furthermore, according to an exemplary embodiment of the present invention, the color filter layer is provided in the white sub-pixel, and, thus, reflectivity with respect to an external light can be reduced while a white color of the white sub-pixel is maintained.

The effects of the present invention are not limited to the aforementioned effects, and other effects, which are not mentioned above, will be apparent to a person having ordinary skill in the art from the following description.

The objects to be achieved by the invention, the means for achieving the objects, and effects of the invention described above do not specify essential features of the claims, and, thus, the scope of the claims is not limited to the disclosure of the invention.

BRIEF DESCRIPTION OF THE DRAWINGS

The above and other aspects, features and other advantages of the present invention will be more clearly understood from the following detailed description taken in conjunction with the accompanying drawings, in which:

FIG. 3A to FIG. 3F are schematic cross-sectional views of a method of manufacturing a display apparatus according to an exemplary embodiment of the present invention;

DETAILED DESCRIPTION OF THE PREFERRED EMBODIMENT

Figure 1:
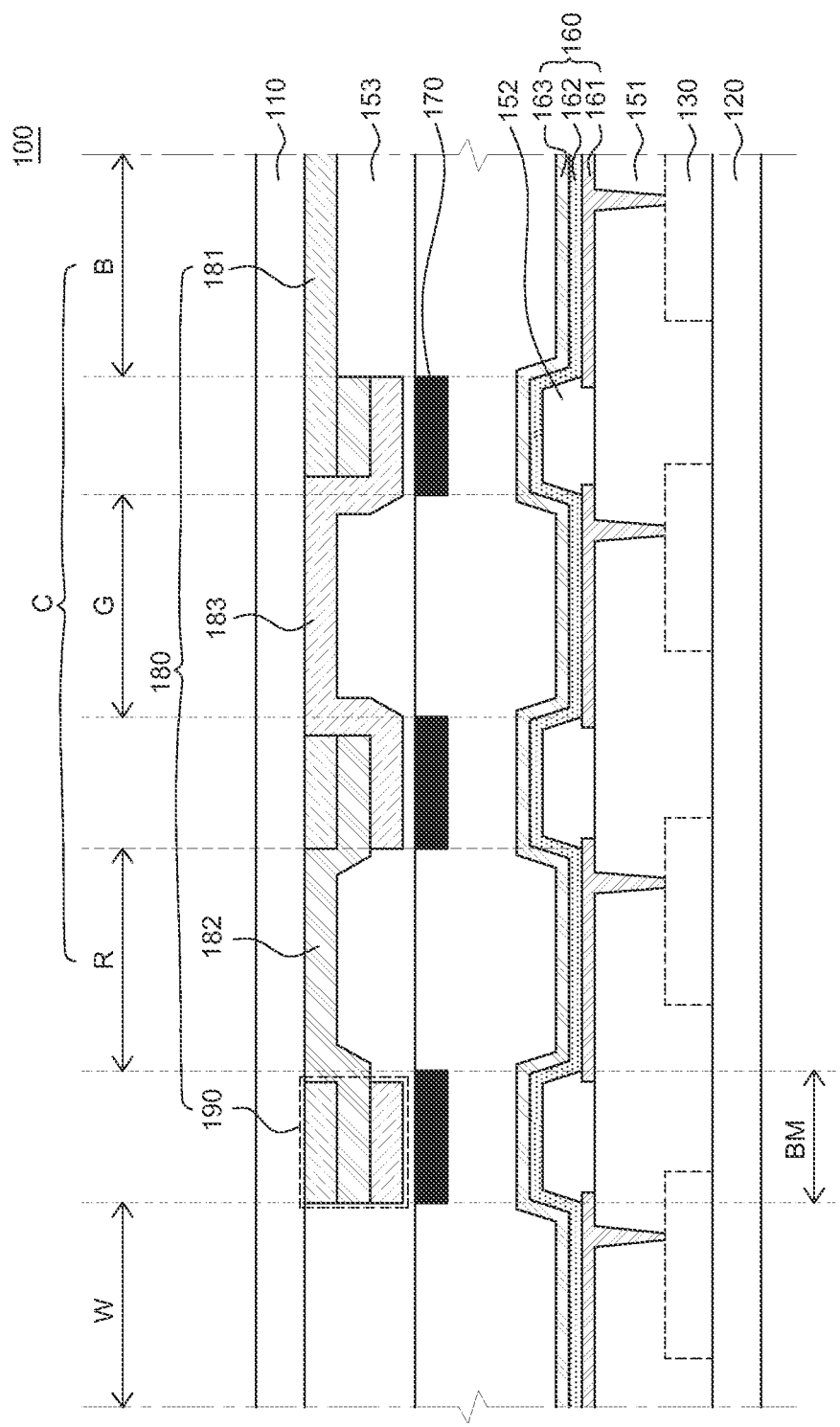
FIG. 1 is a schematic cross-sectional view of a display apparatus which includes a color filter overlapped unit and is reduced in reflectivity with respect to an external light according to an exemplary embodiment of the present invention.

Advantages and features of the present invention, and methods for accomplishing the same will be more clearly understood from exemplary embodiments described below with reference to the accompanying drawings. However, the present invention is not limited to the following exemplary embodiments but may be implemented in various different forms. The exemplary embodiments are provided only to complete disclosure of the present invention and to fully provide a person having ordinary skill in the art to which the present invention pertains with the category of the invention, and the present invention will be defined by the appended claims.

The shapes, sizes, ratios, angles, numbers, and the like shown in the accompanying drawings for describing the exemplary embodiments of the present invention are merely examples, and the present invention is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When the relation in order of time is described using the terms such as "after", "subsequent to", "next to", and "before", discontinuous relations may be included unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present invention.

The features of various embodiments of the present invention can be partially or entirely bonded to or combined with each other and can be interlocked and operated in technically various ways as can be fully understood by a person having ordinary skill in the art, and the embodiments can be carried out independently of or in association with each other.

Hereinafter, there will be described a structure of a color filter and a black matrix for improving visibility by reducing reflectivity from a display apparatus with respect to an external light according to an exemplary embodiment of the present invention.

Various exemplary embodiments of the present invention will be described in detail with reference to the accompanying drawings.

FIG. 1 is a schematic cross-sectional view of a display apparatus which includes a color filter overlapped unit and is reduced in reflectivity with respect to an external light according to an exemplary embodiment of the present invention. Referring to FIG. 1, there is provided a display apparatus 100 in which a color filter layer 180 is disposed on a first substrate 110 and which includes a white sub-pixel W, a red sub-pixel R, a green sub-pixel G, and a blue sub-pixel B. A second substrate 120 may include any one of glass, plastic, and metal and may include a protective layer that prevents permeation of oxygen and moisture.

A thin film transistor (TFT) 130 is formed on the second substrate 120. The TFT 130 is an element for driving an organic light emitting element 160 and may include a source electrode, a drain electrode, an active layer, and a gate electrode.

An insulating layer 151 is formed on the TFT 130, and banks 152 and the organic light emitting elements 160 for separating the respective sub-pixels R, G, B, and W are formed on the insulating layer 151.

The organic light emitting element 160 includes a pixel electrode 161, an organic light emitting layer 162, and a common electrode 163. To be specific, the pixel electrode 161 is formed on the insulating layer 151, the organic light emitting layer 162 is formed on the pixel electrode 161, and the common electrode 163 is formed on the organic light emitting layer 162. As illustrated in FIG. 1, if the display apparatus 100 is of top emission type, in order to emit a light generated from the organic light emitting layer 162 toward an upper side of the display apparatus 100, the pixel electrode 161 may function as a reflection plate, or a separate reflection plate may be disposed under the pixel electrode 161. The organic light emitting layer 162 emits light when a hole and an electron injected through the common electrode 163 and the pixel electrode 161 recombine to form an exciton that decays radiatively.

Although the organic light emitting layer 162 is simply illustrated in FIG. 1, the organic light emitting layer 162 may have a structure including a plurality of layers respectively formed of different materials in order to increase luminance efficiency and stability of the organic light emitting layer 162 and may include, for example, a hole injection layer, a hole transporting layer, a light emitting layer, an electron transporting layer, an electron injection layer, and the like.

A color filter layer 180 is formed at the first substrate 110. To be specific, referring to FIG. 1, the color filter layer 180 is disposed on or under the first substrate 110. In the display apparatus 100, a light emitted from the organic light emitting layer 162 on the second substrate 120 penetrates the color filter layer 180, so that a color is expressed.

Referring to FIG. 1, the display apparatus 100 includes a colored sub-pixel part C and the white sub-pixel W, and the colored sub-pixel part C includes sub-pixels divided into the red sub-pixel R, the green sub-pixel G, and the blue sub-pixel B.

The color filter layer 180 includes a blue color filter 181 disposed in the blue sub-pixel B, a red color filter 182 disposed in the red sub-pixel R, a green color filter 183 disposed in the green sub-pixel G, and a color filter overlapped unit 190 disposed in a black matrix area BM. In order to reduce reflectivity with respect to an external light incident from the outside of the first substrate 110, the color filter layer 180 in the black matrix area BM defined by a black matrix 170 includes the color filter overlapped unit 190. The color filter overlapped unit 190 can be formed while the color filter layer 180 is formed, and details thereof will be described later.

An overcoating layer 153 is formed on the color filter layer 180. The black matrix 170 is formed on or under the overcoating layer 153.

The progress of an external light incident in the display apparatus 100 will be described in detail. An external light incident from the outside of the first substrate 110 penetrates the color filter layer 180 and is reflected from various components formed on the second substrate 120 and then released toward an upper side of the first substrate 110.

Particularly, the black matrix 170 disposed in the black matrix area BM has a higher reflectivity with respect to a light incident from the outside of the first substrate 110 than the color filter layer 180 disposed in the colored sub-pixel part C. Thus, in the display apparatus 100, the color filter overlapped unit 190 is formed on the black matrix area BM in order to reduce reflectivity from the black matrix area BM with respect to an external light.

The external light incident from the outside is reduced in an amount of light while penetrating the first substrate 110 and the color filter overlapped unit 190. Also, the external light reflected from the black matrix 170 is reduced in an amount of light while penetrating the color filter overlapped unit 190 again.

The color filter overlapped unit 190 has a structure in which the color filters are stacked on the first substrate 110 in order of decreasing reflectivity and reduces reflectivity with respect to an external light. Herein, the color filter overlapped unit 190 may have a thickness of 4 to 6 μm.

Meanwhile, a light emitted from the organic light emitting layer 162 of the second substrate 120 penetrates the color filter layer 180 and is released to the outside. The color filter overlapped unit 190 reduces interference between adjacent sub-pixels, and, thus, reduces mixing of colors in the display apparatus 100.

Figure 2:
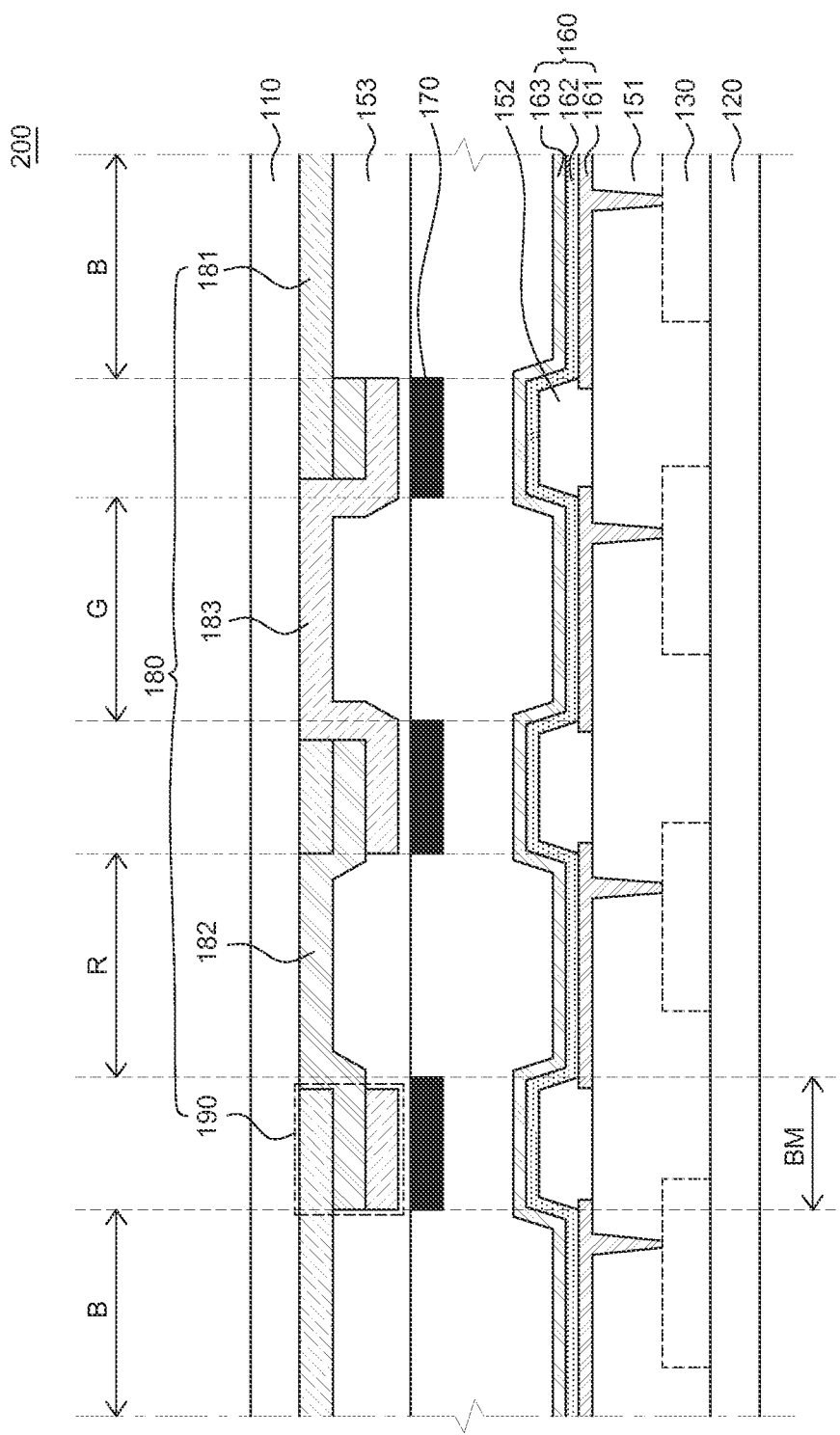
FIG. 2 is a schematic cross-sectional view of a display apparatus which include a color filter overlapped unit and has a RGB structure according to another exemplary embodiment of the present invention.

FIG. 2 is a schematic cross-sectional view of a display apparatus which include a color filter overlapped unit and has a RGB structure according to another exemplary embodiment of the present invention.

Referring to FIG. 2, there is provided a display apparatus 200 in which the color filter layer 180 is disposed on the first substrate 110 and which includes the red sub-pixel R, the green sub-pixel G, and the blue sub-pixel B. The display apparatus 200 illustrated in FIG. 2 is different from the display apparatus illustrated in FIG. 1 only in that a white sub-pixel is omitted. Therefore, redundant explanation of substantially the same components will be omitted.

The overcoating layer 153 and the black matrix 170 are formed on the color filter layer 180. The color filter overlapped unit 190 is formed in the black matrix area BM defined by the black matrix 170. The color filter overlapped unit 190 reduces reflectivity from the black matrix BM with respect to an external light and reduces interference between adjacent sub-pixels, and, thus, reduces mixing of colors in the display apparatus 200, as described above.

FIG. 3A to FIG. 3F are schematic cross-sectional views of a method of manufacturing a display apparatus according to an exemplary embodiment of the present invention.

Figure 3A:
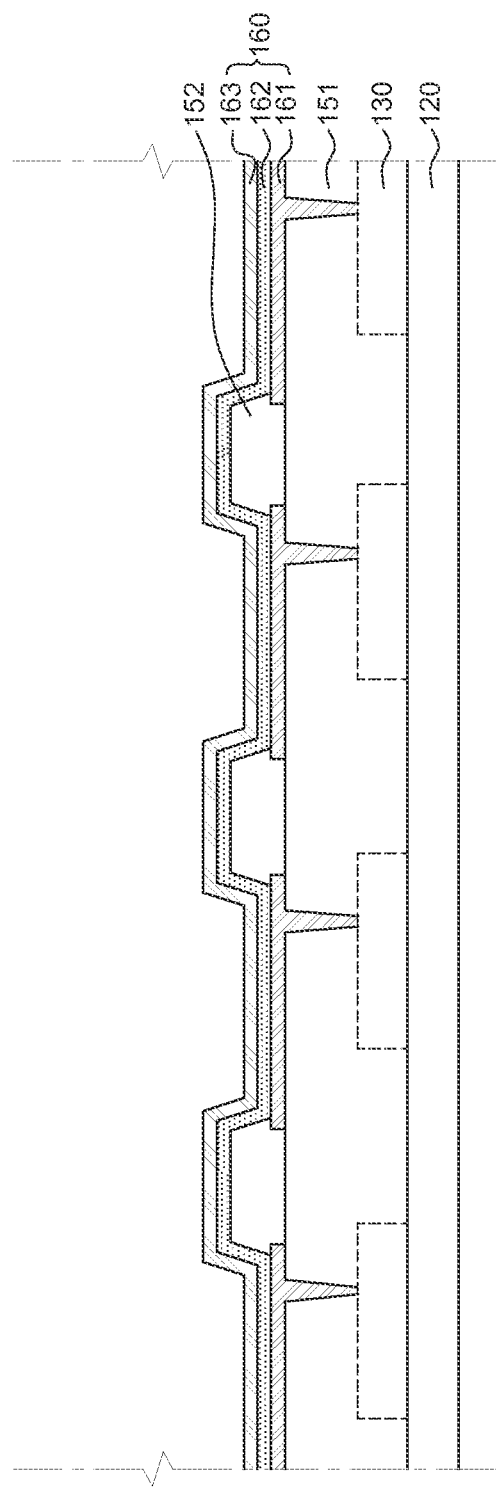

Referring to FIG. 3A, although illustration of processes for forming the components illustrated in FIG. 3A is omitted, the TFT 130, the insulating layer 151, the pixel electrode 161, the bank 152, the organic light emitting layer 162, and the common electrode 163 are formed stage by stage on the second substrate 120.

Figure 3C:
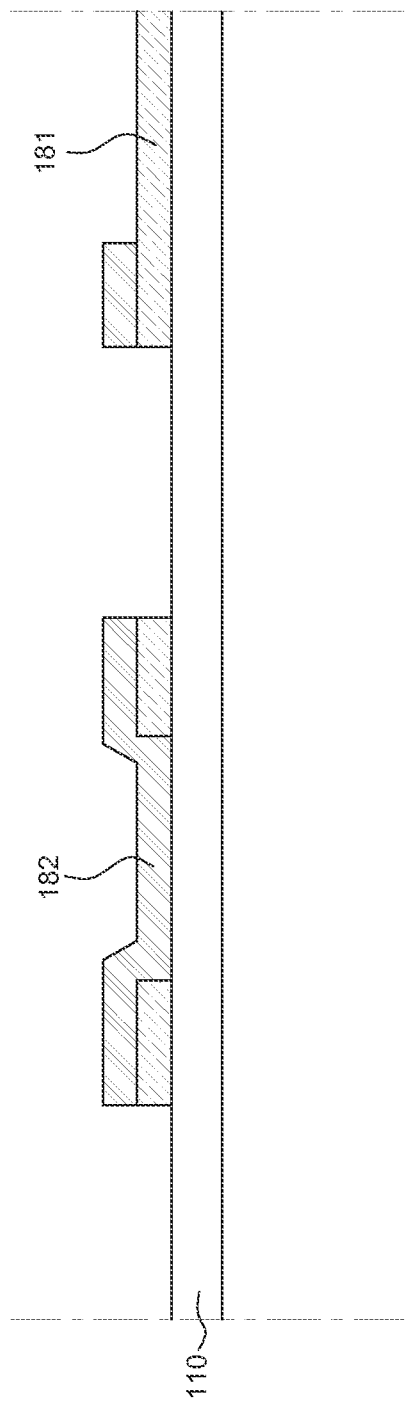
Figure 3D:
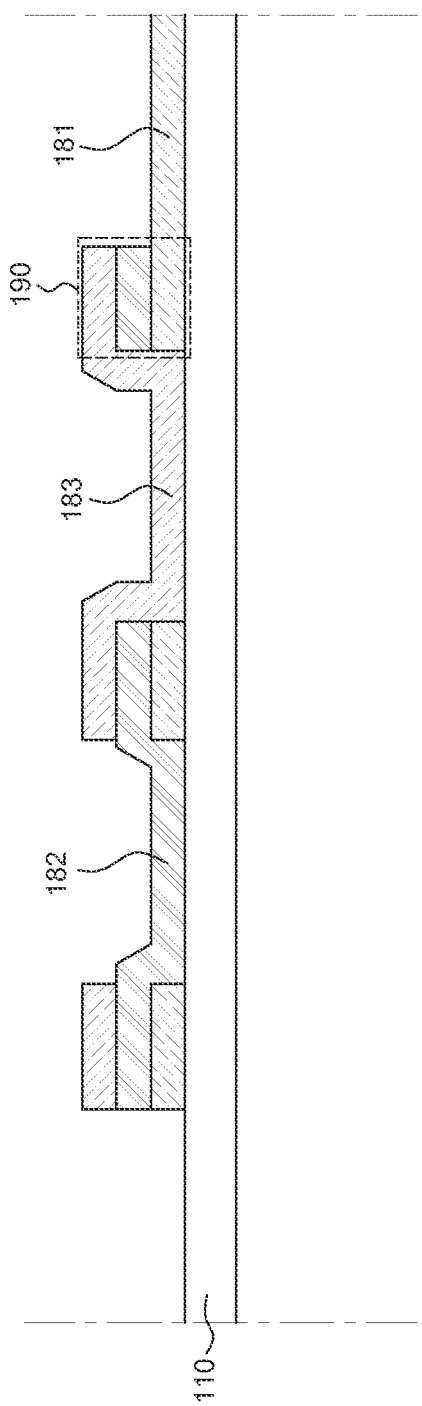

Referring to FIG. 3B, FIG. 3C, and FIG. 3D, the blue color filter 181, the red color filter 182, and the green color filter 183 are formed in order on the first substrate 110 facing the second substrate 120 so as to form the color filter layer 180. Herein, the color filter overlapped unit 190 may be formed without undergoing a separate process while the color filter layer 180 is formed.

As a method for forming the color filter layer 180, the first substrate 110 is coated with the blue color filter 181, the red color filter 182, and the green color filter 183 and etched by means of dry etching or the like using a mask (not illustrated), so that the color filter layer 180 can be formed at a position specified by a designer.

To be specific, the first substrate 110 is coated with the blue color filter 181 and unnecessary parts are removed by a dry etching process using a mask. As a result, the blue color filter 181 as illustrated in FIG. 3B is formed.

When the blue color filter 181 is formed, the blue color filter 181 is also formed in an area where the color filter overlapped unit 190 will be formed.

Then, the red color filter 182 is formed in the same manner as the blue color filter 181. The red color filter 182 is formed on the blue color filter 181 so as to be overlapped with the blue color filter 181 in the area where the color filter overlapped unit 190 will be formed.

Then, the green color filter 183 is also formed in the same manner.

When the green color filter 183 is formed, the green color filter 183 is formed on the blue color filter 181 and the red color filter 182 so as to be overlapped with the blue color filter 181 and the red color filter 182 in the area where the color filter overlapped unit 190 will be formed.

Figure 3E:
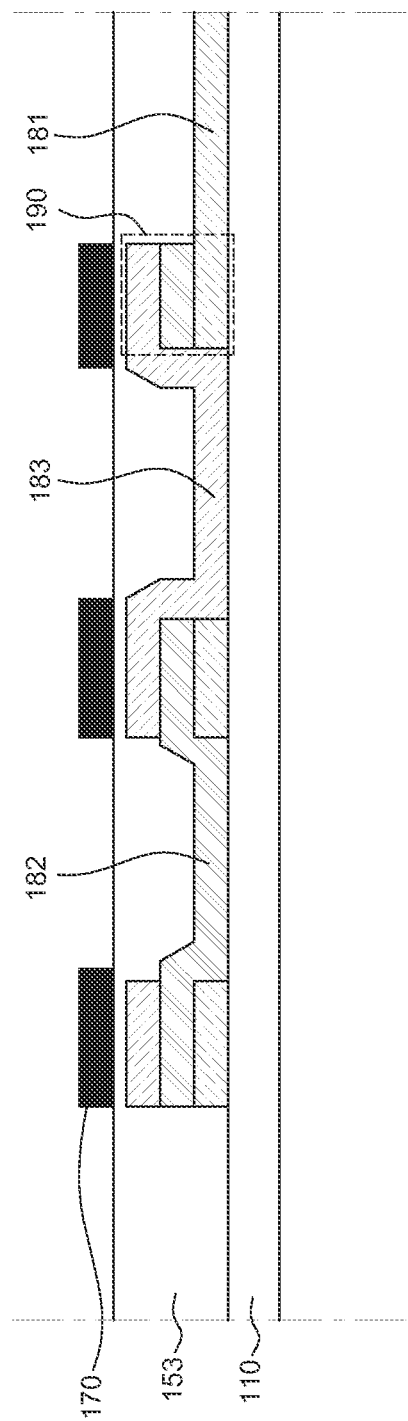

Referring to FIG. 3E, the overcoating layer 153 is formed on the color filter layer 180 and the black matrix 170 is formed thereon. Herein, the black matrix 170 is formed so as to be overlapped with the color filter overlapped unit 190.

The overcoating layer 153 may be formed by spin-coating in order to planarize an upper portion of the color filter layer 180, or may be omitted.

Figure 3F:
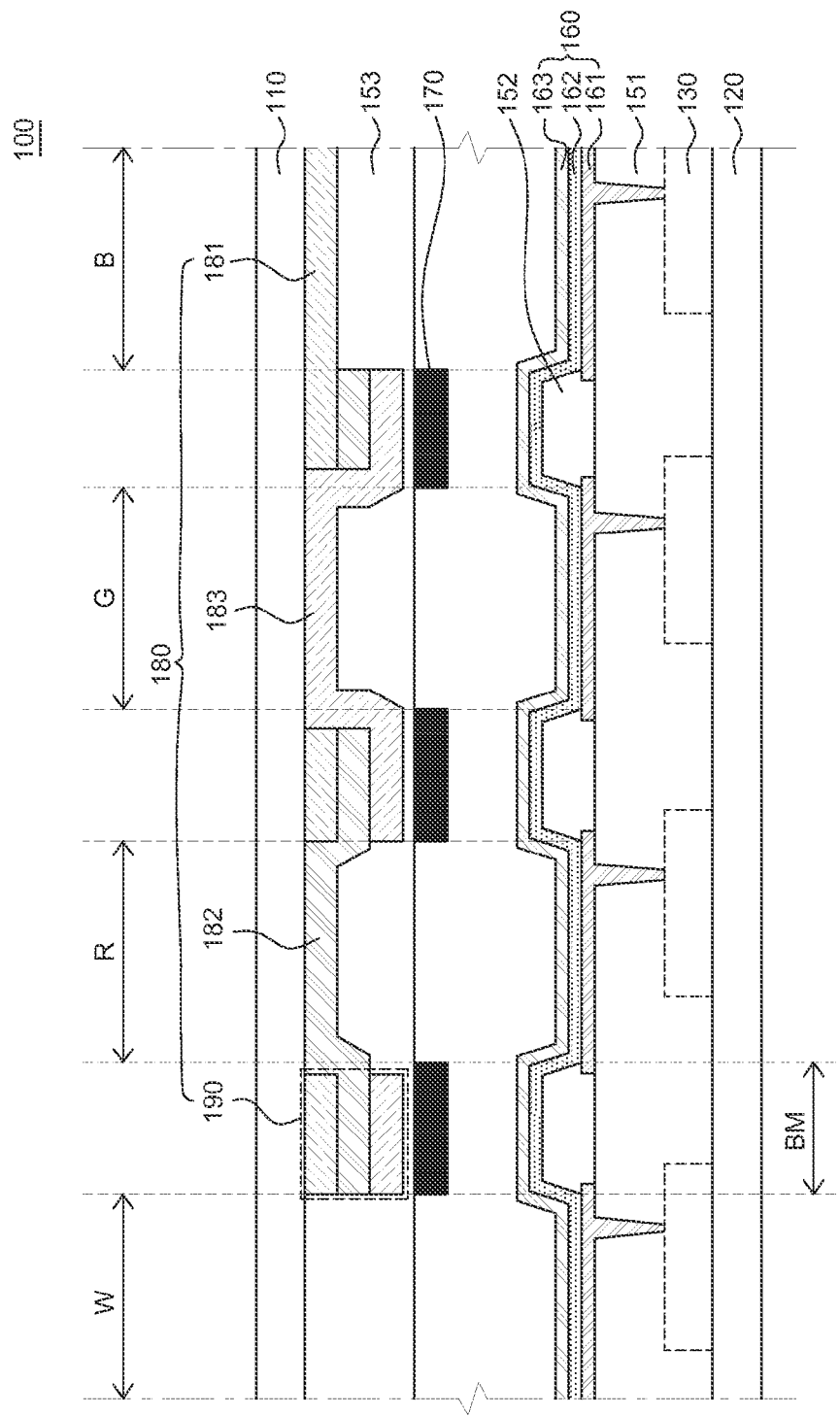

Referring to FIG. 3F, illustration of a detailed bonding process is omitted. The first substrate 110 and the second substrate 120 complete the display apparatus 100 through a bonding process.

Figure 4:
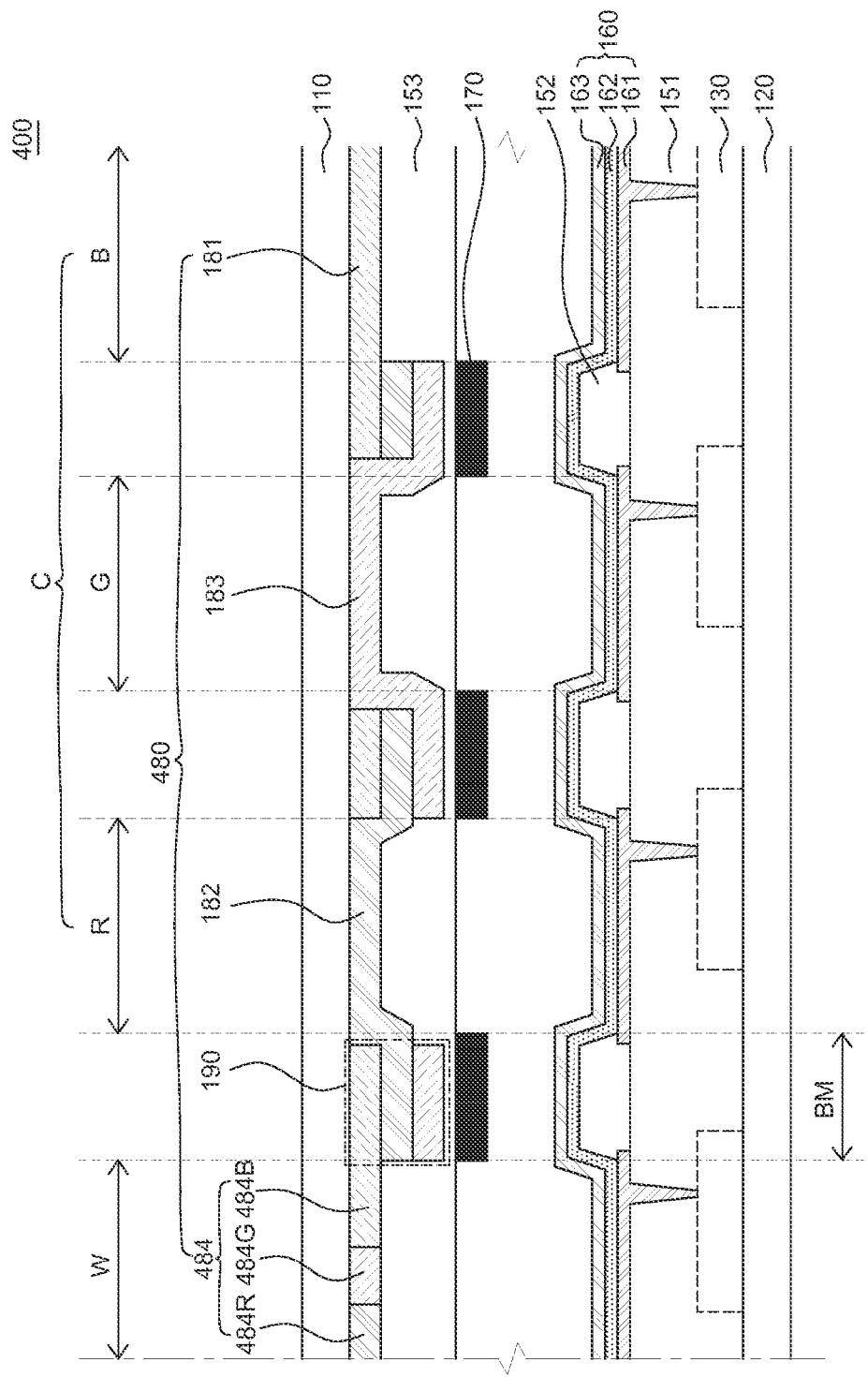
FIG. 4 is a schematic cross-sectional view of a display apparatus reduced in reflectivity from a white sub-pixel part with respect to an external light according to an exemplary embodiment of the present invention.

FIG. 4 is a schematic cross-sectional view of a display apparatus reduced in reflectivity from a white sub-pixel part with respect to an external light according to an exemplary embodiment of the present invention. A display apparatus 400 illustrated in FIG. 4 is different from the display apparatus illustrated in FIG. 1 only in that a color filter layer further includes a color filter segment unit 484. Therefore, redundant explanation of substantially the same components will be omitted.

A color filter layer 480 further includes the color filter segment unit 484 disposed on the white sub-pixel W. Thus, the color filter layer 480 reduces reflectivity from the white sub-pixel W with respect to an external light.

When an external light is incident in the white sub-pixel W, an amount of light penetrating the color filter segment unit 484 is reduced and an amount of light reflected from the components of the display apparatus 400 such as the pixel electrode 161 is reduced. As a result, reflectivity from the white sub-pixel W with respect to the external light is reduced.

The color filter segment unit 484 includes a red segment 484R, a green segment 484G, and a blue segment 484B in order to maintain a color of a white light emitted from the white sub-pixel W. Herein, the red segment 484R is formed of the same material as that of the red color filter 182, the green segment 484G is formed of the same material as that of the green color filter 183, and the blue segment 484B is formed of the same material as that of the blue color filter 181. Herein, the blue segment 484B having the lowest reflectivity with respect to an external light may be formed into 10% to 50% of a size of the color filter segment 484. Otherwise, the green segment 484G may be formed into 10% to 50% of the size of the color filter segment 484 in consideration of luminance efficiency of the white sub-pixel W. Although FIG. 4 illustrates that the color filter segment unit 484 includes the red segment 484R, the green segment 484G, and the blue segment 484B in order to emit a white light, the color filter segment unit 484 may include another combination of segments of other complementary colors which can produce a white light. For example, the color filter segment unit 484 may include blue and yellow segments.

Figure 5:
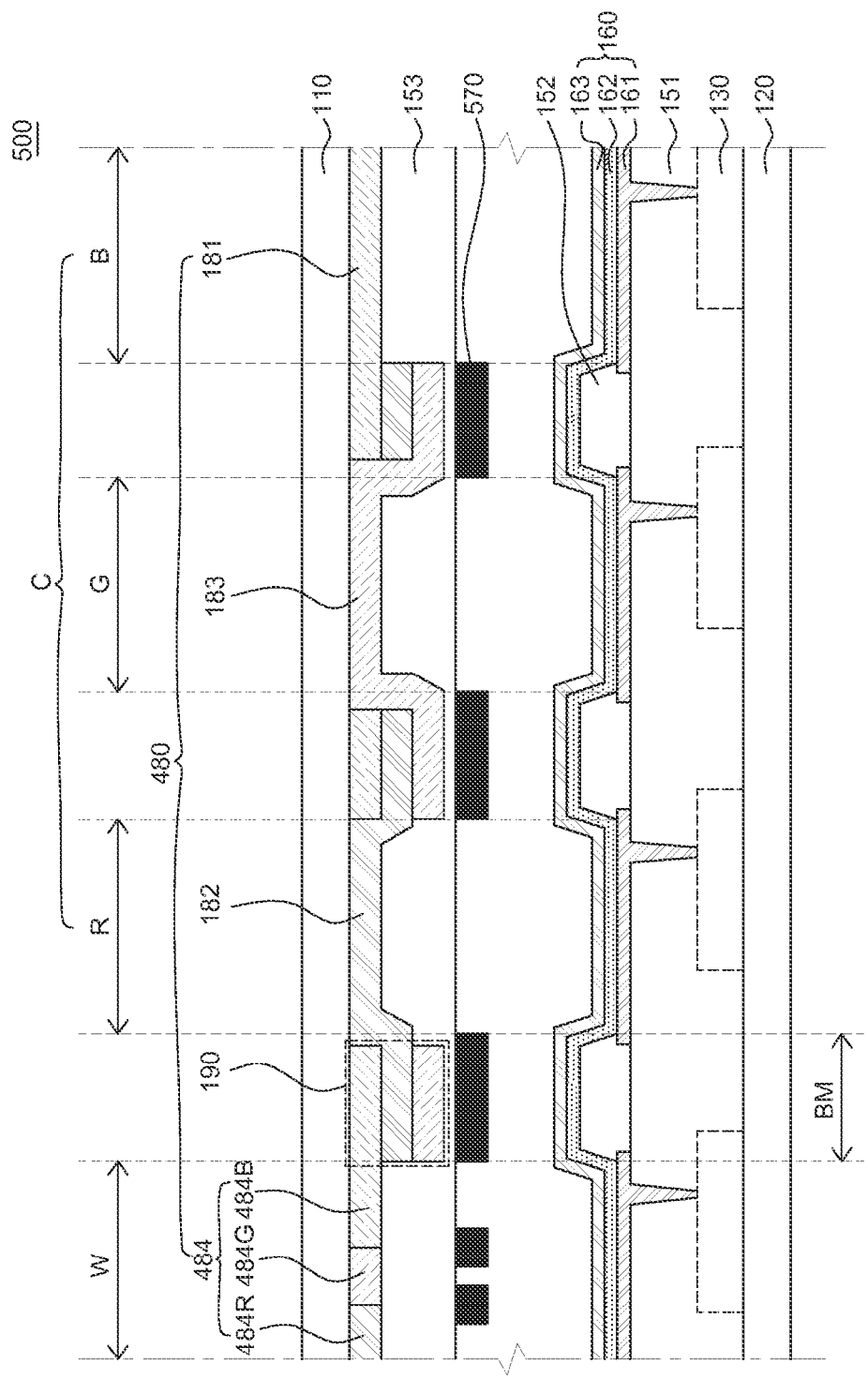
FIG. 5 is a schematic cross-sectional view of a display apparatus according to another exemplary embodiment of the present invention.

FIG. 5 is a schematic cross-sectional view of a display apparatus according to another exemplary embodiment of the present invention. A display apparatus 500 illustrated in FIG. 5 is different from the display apparatus 400 illustrated in FIG. 4 only in an arrangement position of a black matrix 570. Therefore, redundant explanation of substantially the same components will be omitted.

Referring to FIG. 5, the black matrix 570 is formed under the color filter segment unit 484 disposed on the white sub-pixel W.

The black matrix 570 formed under the color filter segment unit 484 is formed at the boundaries among the red segment 484R, the green segment 484G, and the blue segment 484B constituting the color filter segment unit 484, and, thus, prevents mixing of colors and producing Moire effect caused by lights penetrating the segments constituting the color filter segment unit 484. Therefore, reflectivity from the white sub-pixel W with respect to an external light can be further reduced since the black matrix 570 is additionally disposed under the color filter segment unit 484 while a white light emitted from the white sub-pixel W is maintained.

Figure 6:
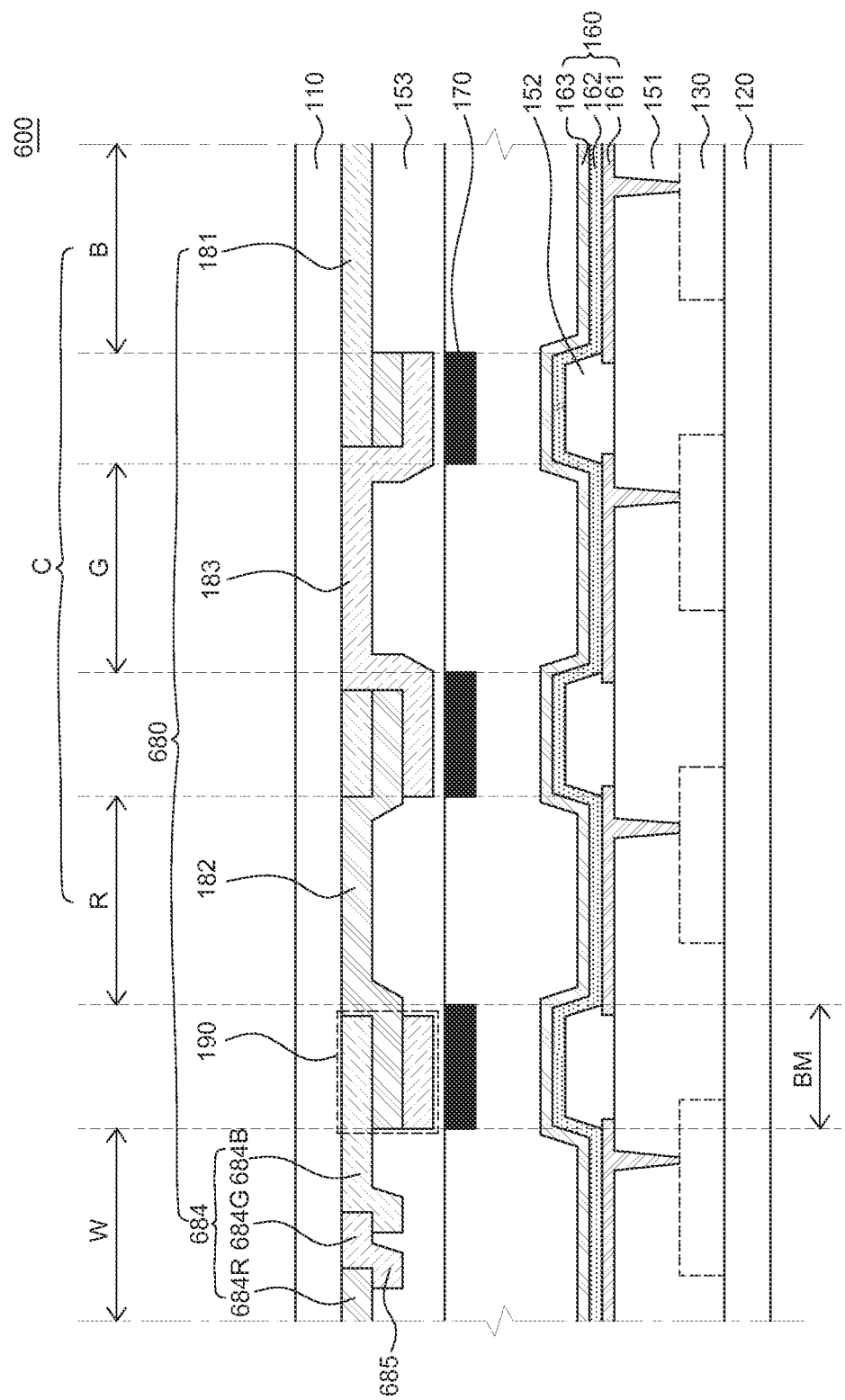
FIG. 6 is a schematic cross-sectional view of a display apparatus according to yet another exemplary embodiment of the present invention.

FIG. 6 is a schematic cross-sectional view of a display apparatus according to yet another exemplary embodiment of the present invention. A display apparatus 600 illustrated in FIG. 6 is different from the display apparatus 400 illustrated in FIG. 4 only in a color filter segment unit 684 and an auxiliary color segment 685 of a color filter layer 680. Therefore, redundant explanation of substantially the same components will be omitted.

When segments of multiple colors are formed, if the segments are formed so as to be overlapped, an effect of reducing a cell gap caused by a process deviation can be expected and reflectivity from overlapped portions between the segments with respect to an external light can be further reduced.

Referring to FIG. 6, the auxiliary color segment 685 is formed at the boundaries among a red segment 684R, a green segment 684G, and a blue segment 684B which are adjacent to each other.

The auxiliary color segment 685 may be formed by extending the red segment 684R, the green segment 684G, and the blue segment 684B constituting the color filter segment unit 684, and may be formed while the color filter segment unit 684 is formed or may be formed through a separate process.

The auxiliary color segment 685 is formed to have a thickness of 1 to 2.5 μm, and preferably may be formed in 30% or less of a size of the color filter segment 684 in consideration of efficiency of the white sub-pixel W.

Figure 7:
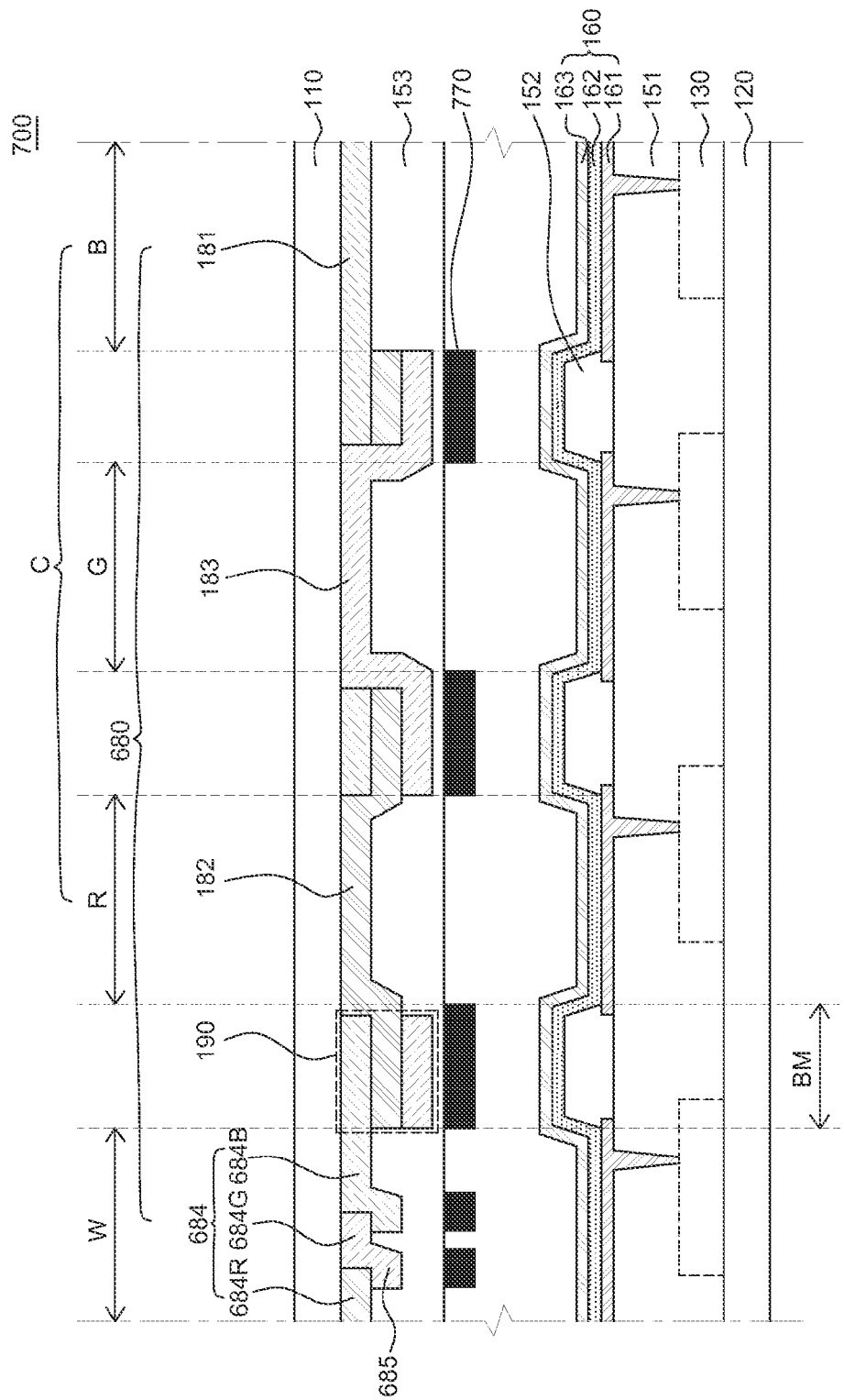
FIG. 7 is a schematic cross-sectional view of a display apparatus according to still another exemplary embodiment of the present invention.

FIG. 7 is a schematic cross-sectional view of a display apparatus according to still another exemplary embodiment of the present invention. A display apparatus 700 illustrated in FIG. 7 is different from the display apparatus 600 illustrated in FIG. 6 only in an arrangement position of a black matrix 770. Therefore, redundant explanation of substantially the same components will be omitted.

Referring to FIG. 7, the black matrix 770 is formed under the color filter segment unit 684 disposed on the white sub-pixel W.

The black matrix 770 formed under the color filter segment unit 684 is formed at the boundaries among the red segment 684R, the green segment 684G, and the blue segment 684B constituting the color filter segment unit 684, and, thus, prevents mixing of colors and producing Moire effect caused by lights penetrating the segments constituting the color filter segment unit 684. Therefore, reflectivity from the white sub-pixel W with respect to an external light can be further reduced since the black matrix 770 is additionally disposed under the color filter segment unit 684 while a white light emitted from the white sub-pixel W is maintained.

Although the exemplary embodiments of the present invention have been described in detail with reference to the accompanying drawings, the present invention is not limited thereto and may be embodied in many different forms without departing from the technical concept of the present invention. Therefore, the exemplary embodiments of the present invention are provided for illustrative purposes only but not intended to limit the technical concept of the present invention. The scope of the technical concept of the present invention is not limited thereto. Therefore, it should be understood that the above-described exemplary embodiments are illustrative in all aspects and do not limit the present invention. The protective scope of the present invention should be construed based on the following claims, and all the technical concepts in the equivalent scope thereof should be construed as falling within the scope of the present invention.

What is claimed is:

1. A display apparatus comprising:
    a color filter layer which is disposed on a first substrate and includes at least a red color filter, a green color filter, and a blue color filter;
    a black matrix disposed on the color filter layer;
    a color filter overlapped unit where the red, green and blue color filters are overlapped in a black matrix area corresponding to the black matrix; and
    a plurality of sub-pixels defined by the black matrix and including a white sub-pixel,
    wherein the color filter layer further includes a color filter segment unit disposed on the white sub-pixel.

2. The display apparatus according to claim 1, wherein the color filter overlapped unit has a structure in which the blue, red and green color filters are stacked on the first substrate in order of increasing reflectivity.

3. The display apparatus according to claim 1, further comprising:
    a second substrate which faces the first substrate and on which an organic light emitting element is disposed, and
    wherein the organic light emitting element is a white light emitting element.

4. The display apparatus according to claim 1, wherein the color filter segment unit includes at least one of red, blue and green segments.

5. The display apparatus according to claim 1 wherein:
    the black matrix is disposed on the color filter segment unit.

6. The display apparatus according to claim 1, further comprising:
    an auxiliary color segment on the color filter segment unit, and
    wherein the auxiliary color segment is formed by extending a part of the color filter segment unit.

7. A display apparatus comprising:
    a white sub-pixel;
    a colored sub-pixel part including a red sub-pixel, a green sub-pixel and a blue sub-pixel;
    a black matrix area between the white sub-pixel and the colored sub-pixel part;
    a color filter layer disposed in the colored sub-pixel part and the black matrix area; and
    a color filter segment unit disposed on the white sub-pixel, wherein the color filter layer includes a color filter overlapped unit disposed in the black matrix area and having a structure in which color filters of the color filter layer are stacked.

8. The display apparatus according to claim 7, wherein the color filter segment unit includes at least one of red, blue and green segments.

9. The display apparatus according to claim 7, further comprising black matrix material corresponding to the color filter segment unit.

10. A display apparatus comprising;
    a color filter structure on a first substrate;
    an overcoat layer covering the color filter structure; and
    a black matrix, on the overcoat layer, having black matrix segments that provide boundaries to separate and define at least four sub-pixel regions,
    wherein the color filter structure is configured to have different color layers, with a first color layer at a first sub-pixel region, a second color layer at a second sub-pixel region, a third color layer at a third sub-pixel region, and a stack of the first through third color layers at the boundaries between adjacent sub-pixel regions, and the stack of first through third color layers is configured by overlapping of adjacent color layers with a particular stacked order that effectively minimizes reflectivity of external light without using a polarization plate.

11. The display apparatus according to claim 10, wherein the particular stacked order is a blue color layer, a red color layer, and a green color layer in sequence from the first substrate towards the black matrix.

12. The display apparatus according to claim 11, further comprising a second substrate having a single organic light emitting layer configured to emit white color light along an array of pixels, the second substrate configured to face the black matrix of the first substrate to achieve an OLED display panel assembly having the array of pixels with each pixel including four sub-pixels defined by the four sub-pixel regions of the first substrate.

13. The display apparatus according to claim 11, further comprising a fourth sub-pixel region configured to pass white light without having any color layers therein.

14. The display apparatus according to claim 11, further comprising a fourth sub-pixel region configured to pass a particular color via at least one color layer therein.

15. The display apparatus according to claim 11, further comprising a fourth sub-pixel region configured to pass white light via two or more color layers disposed adjacently in a side-by-side manner therein.

16. The display apparatus according to claim 15, further comprising additional black matrix segments on the overcoat layer in the fourth sub-pixel region.

17. The display apparatus according to claim 15, wherein one of the adjacent layers among the first through third color layers overlaps the other of the adjacent layers at a boundary thereof.

18. The display apparatus according to claim 15, further comprising additional black matrix segments on the overcoat layer in the fourth sub-pixel region.

* * * * *